United States Patent
Song et al.

(10) Patent No.: US 7,872,909 B2
(45) Date of Patent: Jan. 18, 2011

(54) MEMORY DEVICE AND MEMORY DATA READ METHOD

(75) Inventors: Seung-Hwan Song, Incheon (KR); Heeseok Eun, Yongin-si (KR); Dong Hun Yu, Seoul (KR); Jun Jin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 163 days.

(21) Appl. No.: 12/219,665

(22) Filed: Jul. 25, 2008

(65) Prior Publication Data
US 2009/0207659 A1   Aug. 20, 2009

(30) Foreign Application Priority Data
Feb. 19, 2008   (KR) .................. 10-2008-0014945

(51) Int. Cl.
*G11C 16/04* (2006.01)
(52) U.S. Cl. ............. 365/185.03; 365/200; 365/185.09; 365/185.24; 365/185.02
(58) Field of Classification Search ............ 365/185.03, 365/200, 185.09, 185.24, 185.02
See application file for complete search history.

(56) References Cited

U.S. PATENT DOCUMENTS

| | | | | |
|---|---|---|---|---|
| 6,185,134 B1 * | 2/2001 | Tanaka | .................. | 365/185.33 |
| 6,549,459 B2 * | 4/2003 | Higuchi | .................. | 365/185.09 |
| 6,982,904 B2 * | 1/2006 | Shiga | .................... | 365/185.09 |
| 7,099,190 B2 * | 8/2006 | Noguchi et al. | ........ | 365/185.09 |
| 6,988,227 B1 | 11/2006 | Perrott | | |
| 7,305,596 B2 * | 12/2007 | Noda et al. | .................. | 714/718 |
| 7,362,623 B2 * | 4/2008 | Honma et al. | .......... | 365/189.09 |
| 7,464,259 B2 * | 12/2008 | Sukegawa et al. | .............. | 713/2 |
| 7,551,486 B2 * | 6/2009 | Cornwell et al. | ....... | 365/185.22 |
| 7,558,109 B2 * | 7/2009 | Brandman et al. | ..... | 365/185.03 |
| 7,593,263 B2 * | 9/2009 | Sokolov et al. | ........ | 365/185.17 |
| 7,639,531 B2 * | 12/2009 | Cornwell et al. | ....... | 365/185.03 |
| 7,697,326 B2 * | 4/2010 | Sommer et al. | ........ | 365/185.03 |
| 2005/0050410 A1 | 3/2005 | Pomaranski et al. | | |
| 2006/0277434 A1 | 12/2006 | Tsern et al. | | |
| 2007/0109845 A1 | 5/2007 | Chen | | |
| 2007/0183196 A1 | 8/2007 | Gendrier et al. | | |
| 2007/0258297 A1 | 11/2007 | Hung et al. | | |
| 2007/0263455 A1 | 11/2007 | Cornwell et al. | | |

OTHER PUBLICATIONS

PCT International Search Report and Written Opinion dated Feb. 18, 2009.

* cited by examiner

*Primary Examiner*—Viet Q Nguyen
(74) *Attorney, Agent, or Firm*—Harness, Dickey & Pierce, P.L.C.

(57) ABSTRACT

Provided are memory devices and memory data read methods. A method device may include: a multi-bit cell array; a decision unit that may detect threshold voltages of multi-bit cells of the multi-bit cell array to decide first data from the detected threshold voltages, using a first decision value; an error detector that may detect an error bit of the first data; and a determination unit that may determine whether the decision unit decides second data from the detected threshold voltages using a second decision value, based on a number of detected error bits, the second decision value being different from the first decision value. Through this, it is possible to reduce time spent for reading data stored in the multi-bit cell.

15 Claims, 7 Drawing Sheets

MEMORY DEVICE AND MEMORY DATA READ METHOD

PRIORITY STATEMENT

This application claims priority under 35 U.S.C. §119 to Korean Patent Application No. 10-2008-0014945, filed on Feb. 19, 2008, in the Korean Intellectual Property Office (KIPO), the entire contents of which are incorporated herein by reference.

BACKGROUND

1. Field

Example embodiments relate to apparatuses and/or methods that may read data in memory devices. Also, example embodiments relate to apparatuses and/or methods that may read data in multi-level cell memory devices or multi-bit cell memory devices.

2. Description of Related Art

A single-level cell (SLC) memory device may store one bit of data in a single memory cell. The SLC memory may be referred to as a single-bit cell (SBC) memory. A process of storing one bit of data in a single level cell of the SLC memory device may be referred to as a programming process and may change a threshold voltage of the single level cell. The SLC memory device may have a high threshold voltage level or a low threshold voltage level depending on whether one bit of data stored in the single level cell is "0" or "1". A process of reading data stored in the single level cell may be performed by determining whether a sensed threshold voltage of the single level cell is greater than or less than a reference voltage level or a read voltage level.

Due to a fine electrical characteristic difference between single level cells, the threshold voltage of each single level cell may have a distribution within a predetermined range. For example, when a sensed threshold voltage of the single level cell is greater than 0.5V and less than 1.5V, it may be determined that data stored in the single bit cell has a logic value of "1". When the threshold voltage of the single bit cell is greater than 2.5V and less than 3.5V, it may be determined that the data stored in the single bit cell has a logic value of "0".

A process of sensing the threshold voltage of the single bit cell may be performed by applying a predetermined voltage level to a gate terminal of the single bit cell and sensing the size of current flowing between a source and a drain of the single bit cell.

Meanwhile, a multi-level cell (MLC) memory device that can store data of at least two bits in a single memory cell has been proposed in response to a need for higher integration of memory. The MLC memory device may be referred to as a multi-bit cell (MBC) memory device.

SUMMARY

Example embodiments may provide apparatuses and/or methods that may apply a new multi-level (multi-bit) read scheme in a multi-level cell memory device to thereby reduce a time for reading the data.

Example embodiments may also provide apparatuses and/or methods that may apply an improved or optimal read scheme for each multi-bit cell to thereby reduce an error when reading data.

According to example embodiments, an apparatus may include a memory device. The memory device may include: a multi-bit cell array; a decision unit that may detect threshold voltages of multi-bit cells of the multi-bit cell array to decide first data from the detected threshold voltages, using a first decision value; an error detector that may detect an error bit of the first data; and a determination unit that may determine whether the decision unit decides second data from the detected threshold voltages using a second decision value, based on a number of detected error bits, the second decision value being different from the first decision value.

An apparatus according to example embodiments may include a memory device. The memory device may include: a multi-bit cell array; a threshold voltage detector that may detect threshold voltages of multi-bit cells of the multi-bit cell array; and a determination unit that may select an improved or optimal decision value based on reducing or minimizing the error bits from candidate decision values determining data from the detected threshold voltages.

According to example embodiments, a method of reading data from a memory may include: detecting threshold voltages of multi-bit cells of a multi-bit cell array; deciding first data from the detected threshold voltages using a first decision value; detecting an error bit of the first data; and determining whether to decide second data from the detected threshold voltages using a second decision value, based on a number of detected error bits, the second decision value being different from the first decision value.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
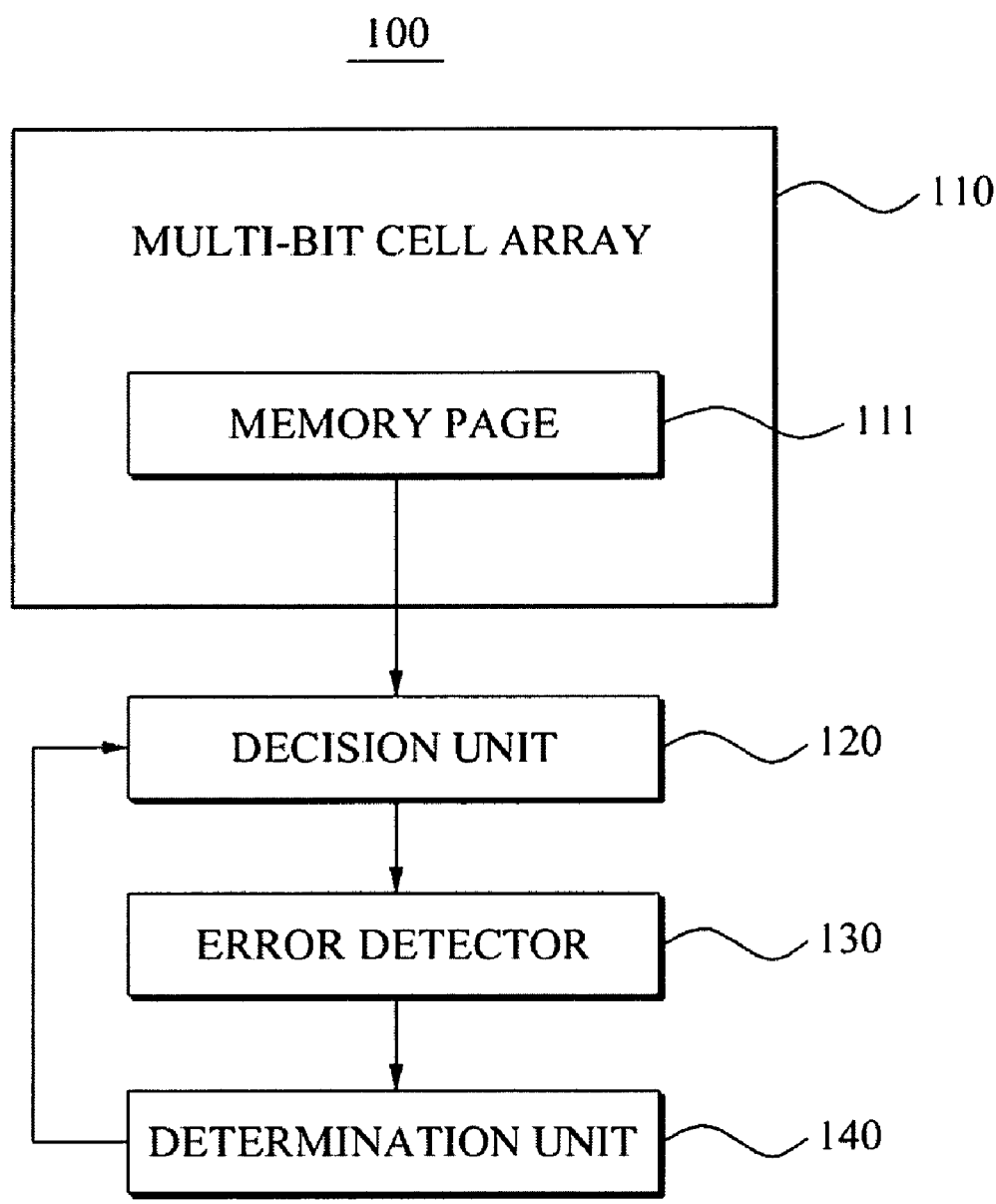
FIG. 1 is a block diagram illustrating a memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

As the number of bits stored in a single multi-bit cell increases, reliability may deteriorate and a read-failure rate may increase. If it is possible to store m bits of data in the single multi-bit cell, a threshold voltage level formed in the single multi-bit cell may be any one of $2^m$ threshold voltage levels. Due to a fine electrical characteristic difference between multi-bit cells, when each of multi-bit cells of a multi-bit cell array can store m bits of data, threshold voltage levels of the multi-bit cells of the multi-bit cell array may form $2^m$ distributions.

However, since the voltage window for a memory device may be limited, interval between adjacent distributions may decrease as 'm' increases. When 'm' further increases, the adjacent distributions may overlap each other. When the adjacent distributions overlap, the read-failure rate of data stored in the multi-bit cells may increase.

Error correction codes or error control codes (ECC) may be used to detect an error in a process of storing data in multi-bit cells and reading the data from the multi-bit cells, and to correct the detected error.

The ECC may add a redundant bit or bits to effective information to thereby detect an error in the effective information and correct the detected error. A memory device according to example embodiments may perform ECC encoding for data while storing the data and store the ECC-encoded data. The memory device may perform ECC decoding for data that is read from the multi-bit cells to extract effective information from the ECC-decoded data.

Examples of an ECC decoding scheme may include a scheme of identifying a number of errors included in read data and a location of one or more detected error bits, a scheme of correcting all the errors when the number of errors is less than a predetermined ratio of errors occurs, and the like.

Cyclic codes and the like may explicitly disclose error correcting capability. Examples of cyclic codes may include a Bose, Ray-Chaudhuri, Hocquenghem (BCH) code, a Reed-Solomon (RS) code, and the like. Decoding schemes associated with the cyclic codes may include a Meggitt decoding scheme, a Berlekamp-Massey decoding scheme, a Euclid decoding scheme, and the like.

FIG. 1 is a block diagram illustrating a memory device 100 according to example embodiments.

The memory device 100 may include a multi-bit cell array 110, a decision unit 120, an error detector 130, and a determination unit 140.

The multi-bit cell array 110 may include a plurality of multi-bit cells. A single multi-bit cell may store multi-bit data. A process of storing, by the memory device 100, data in the single multi-bit cell may be referred to as "programming" and may be performed based on mechanism such as Fowler-Nordheim (F-N) tunneling, and the like.

The programming process may change a threshold voltage of a multi-bit cell. When the single multi-bit cell may store a maximum of m bits of data, any one of $2^m$ threshold voltage levels may be formed in the single multi-bit cell.

In order to reduce time spent for reading data from the multi-bit cell array 110, the memory device 100 may simultaneously read the data from a plurality of adjacent multi-bit cells. A set of the simultaneously read multi-bit cells may be referred to as a "memory page 111". The single memory page 111 may be a set of multi-bit cells connected with a single word line. In FIG. 1, one memory page, memory page 111, is illustrated in multi-bit cell array 110 for purposes of simplicity. However, multi-bit cell array 110 may have any number of memory pages.

The decision unit 120 may detect threshold voltages of multi-bit cells of the memory page 111 to decide first data from the detected threshold voltages, using first decision values.

The decision unit 120 may divide, into a plurality of sections, the threshold voltage range that the multi-bit cells of the multi-bit cell array 110 may have. Each of the divided sections may correspond to a particular value of data. The first decision value may be particular data values corresponding to sections to be divided, respectively. The first decision value may be an interpretation of which data values correspond to each of the threshold voltage sections from the threshold voltage range. The decision unit 120 may decide which section includes each detected threshold voltage. The decision unit 120 may decide first data stored in each multi-bit cell, using a first decision value corresponding to the decided section.

The error detector 130 may detect one or more error bits of the first data. The error detector 130 may perform ECC decoding for the first data to thereby detect the one or more error bits of the first data.

The determination unit 140 may determine whether the decision unit 120 decides second data from the detected threshold voltages using a second decision value, based on a number of detected error bits. According to example embodiments, the second decision value may be different from the first decision value. The second decision value may be an interpretation of which data values correspond to each of the threshold voltage sections from the threshold voltage range that is different from the interpretation of the first decision value. When the determination unit 140 determines to decide the second data, the decision unit 120 may decide the second data from the detected threshold voltages using the second decision value. When the determination unit 140 determines not to decide the second data, the memory device 100 may output the first data. According to example embodiments, when the determination unit 140 determines not to decide the second data, the memory device 100 may output ECC-decoded first data.

The determination unit 140 may select the second decision value based on a pattern of the one or more detected error bits. When a number of detected error bits is greater than a reference value, the determination unit 140 may determine that the decision unit 120 may decide the second data using the second decision value. The determination unit 140 may select the second decision value so that is different from the first decision value, based on the pattern of the detected error bit.

The error detector 130 may perform ECC decoding for the first data to thereby correct the one or more detected error bits. The error detector 130 may compare the decided first data with the corrected data and may also extract an error occurrence pattern based on, for example, a floating gate coupling or charge loss characteristics. The memory device 100 may obtain the coupling or the charge loss characteristics depending on a physical location of a particular multi-bit cell in the multi-bit cell array 110. The memory device 100 may monitor a change in the threshold voltage of the particular multi-bit cell to thereby obtain the coupling or the charge loss characteristics. The memory device 100 may set a particular block of the multi-bit cell array 110 as a monitoring block to thereby monitor the change in the threshold voltage of the multi-bit cell of the monitoring block.

The determination unit 140 may determine whether threshold voltages of multi-bit cells have increased or decreased based on the extracted error pattern. When it is determined the threshold voltages of the multi-bit cells have decreased, the determination unit 140 may assign a particular value of data to a lower threshold voltage section compared to the first decision value to thereby generate the second decision value. Conversely, when it is determined the threshold voltages of the multi-bit cells are increased, the determination unit 140 may assign the particular value of the data to a higher threshold voltage section compared to the first decision value to thereby generate the second decision value.

The charge loss may cause the threshold voltages of the multi-bit cells to decrease over time. When defect is included in an insulating layer disposed around a floating gate that forms the multi-bit cell, charges charged in the floating gate may be discharged over time to thereby decrease the threshold voltages.

Floating gate coupling may cause the threshold voltages of the multi-bit cells to increase according to change in threshold voltages of adjacent multi-bit cells. Due to parasitic capacitance that is formed between the floating gate of the multi-bit cell and floating gates of adjacent multi-bit cells, the change in the threshold voltage of the adjacent multi-bit cells may affect the threshold voltage of the corresponding multi-bit cell.

The determination unit 140 may determine which mechanism is more superior between floating gate coupling and charge loss, based on the pattern of the detected error bit. The determination unit 140 may adjust the first decision value based on the determination result to thereby generate the second decision value. According to example embodiments, the second decision value may be adjusted from the first decision value according to a predetermined order, based on at least one of floating gate coupling and charge loss.

The decision unit 120 may perform hard-decision for the first data from the detected threshold voltages, using the first decision values. The first decision value may be a decision value for hard-decision. For example, first data may be formed from the first decision value based only on which threshold voltage section of the threshold voltage range read threshold voltages fall into. When the determination unit 140 determines decision of the second data, the decision unit 120 may perform hard-decision for the second data using the second decision value. The second decision value may be a decision value for hard-decision. For example, second data may be formed from the second decision value based only on which threshold voltage section of the threshold voltage range read threshold voltages fall into.

The decision unit 120 may perform soft-decision for first data from the detected threshold voltages, using the first decision value. The first decision value may be a log-likelihood ratio (LLR) for soft-decision with respect to the detected threshold voltages. When the determination unit 140 determines decision of the second data, the decision unit 120 may decide the second data using the second decision value. The second decision value may be an LLR for soft-decision with respect to the detected threshold voltages.

The error detector 130 may use an ECC decoding scheme associated with cyclic codes. Therefore, when the number of detected error bits does not exceed error correcting capability, the error detector 130 may correct all the detected error bits. The error correcting capability may be expressed as the number of error bits or a bit error rate (BER) in a number of ECC-decoded bits.

When the number of detected error bits is greater than the error correcting capability, the determination unit 140 may determine that the decision unit 120 may decide second data from the detected threshold voltages, using the second decision values.

The determination unit 140 may identify a multi-bit cell storing a detected error bit. The error detector 130 may perform ECC decoding for the first data to thereby correct the detected error bit and to extract information associated with the detected error bit. The decision unit 120 may decide second data from a detected threshold voltage of the identified multi-bit cell, using the second decision value.

According to example embodiments, the determination unit 140 may determine so that a different decision value may be applied to each of the multi-bit cells of the memory page 111. The determination unit 140 may choose an improved or optimized decision value with respect to each multi-bit cell to thereby reduce the number of error bits.

As the error correcting capability of an ECC decoder increases, hardware complexity for embodying the ECC decoder may increase. The memory device 100 may reduce the number of error bits. Therefore, even though the ECC decoder has the low error correcting capability, it is possible to improve the error correctability. The memory device 100 may decrease the hardware complexity for embodying the ECC decoder.

When the memory device 100 decides first data from the detected threshold voltages and detects the error bit of the first data, and the number of detected error bits is greater than the error correcting capability, a period of time when the memory device 100 detects threshold voltages of multi-bit cells of the memory page 111 may be relatively greater than a period of time when the memory device 100 decides the second data. The memory device 100 according to example embodiments may reduce or minimize a number of times that threshold voltages of the multi-bit cells of the memory page 111 are detected and thereby reduce the total memory data reading time.

Figure 2:
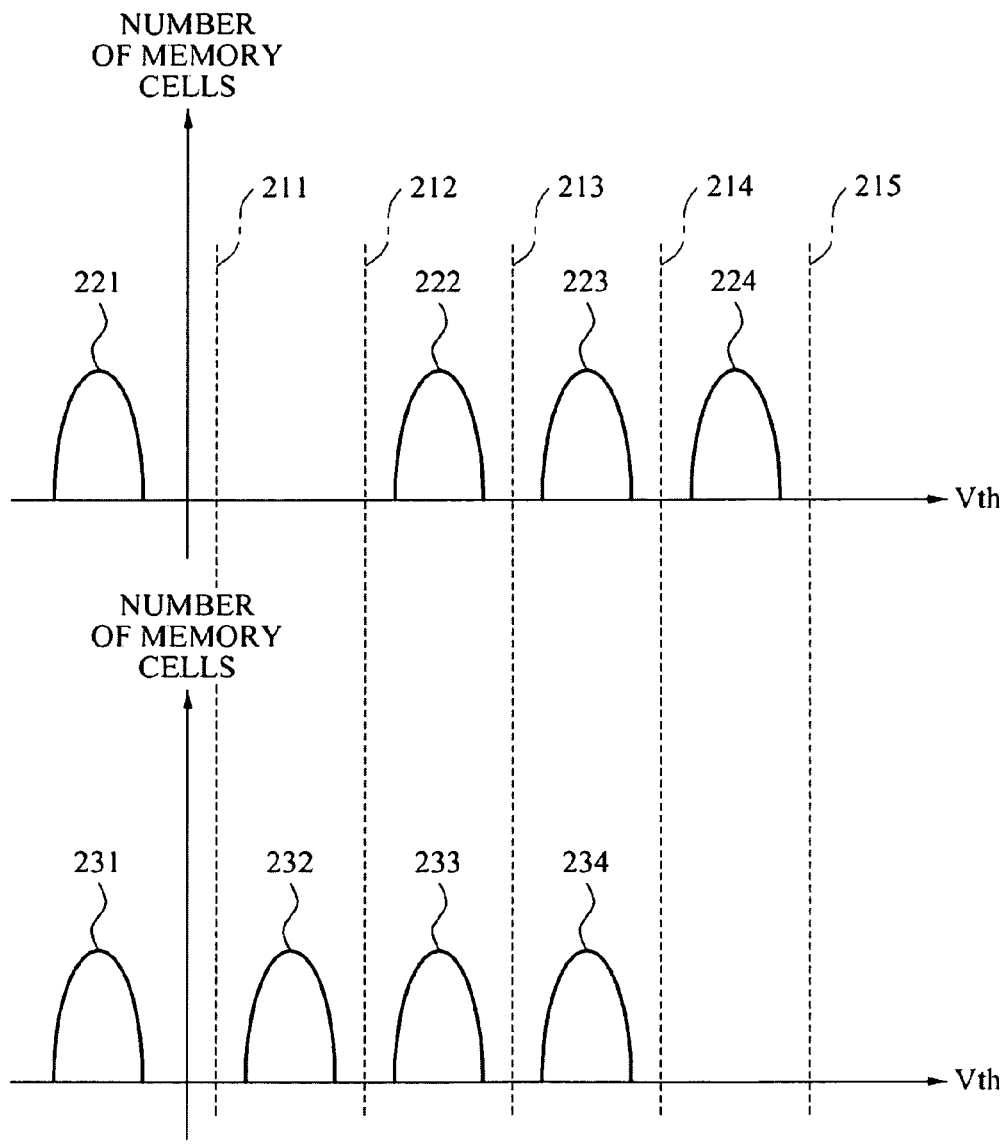
FIG. 2 illustrates an example of an operation of the memory device shown in FIG. 1.

FIG. 2 illustrates an example of an operation of the memory device 100 shown in FIG. 1.

In FIG. 2, the horizontal axis denotes the threshold voltage of multi-bit cells and the vertical axis denotes the number of multi-bit cells that have a corresponding threshold voltage. In FIG. 2, two-bit data is stored in each multi-bit cell. In FIG. 2, the decision unit 120 may perform hard-decision for first data.

The memory device 100 may program each multi-bit cell to have a target threshold voltage corresponding to data stored in each multi-bit cell. Since the two-bit data may have any one of four values, "11", "10", "00", and "01", each multi-bit cell may have any one of four target threshold voltages.

Each multi-bit cell may have fine electrical characteristic difference. Therefore, threshold voltages of different multi-bit cells that store the same data, for example, "01" may be different from each other. Threshold voltages of multi-bit cells storing particular data may form a predetermined range of distribution.

The threshold voltage of multi-bit cells may change over time from a point immediately after programming. The threshold voltage of the multi-bit cells may be affected by the change in the threshold voltage of adjacent different multi-bit cells and thereby change.

Immediately after data "11" is programmed, a threshold voltage of multi-bit cells storing data "11" may form a distribution 221. After a predetermined period of time is elapsed, the threshold voltage of multi-bit cells storing data "11" may form a distribution 231. It is assumed that the difference between the distributions 221 and 231 may be insignificant.

Immediately after data "10" is programmed, a threshold voltage of multi-bit cells storing data "10" may form a distribution 222. The threshold voltage of multi-bit cells storing data "10" may decrease over time. After a predetermined period of time is elapsed, the threshold voltage of multi-bit cells storing data "10" may form a distribution 232.

Immediately after data "00" is programmed, a threshold voltage of multi-bit cells storing data "00" may form a distribution 223. The threshold voltage of multi-bit cells storing data "00" may decrease over time. After a predetermined period of time is elapsed, the threshold voltage of multi-bit cells storing data "00" may form a distribution 233.

Immediately after data "01" is programmed, a threshold voltage of multi-bit cells storing data "01" may form a distribution "224". The threshold voltage of multi-bit cells storing data "01" may decrease over time. After a predetermined period of time is elapsed, the threshold voltage of multi-bit cells storing data "01" may form a distribution 234.

Hereinafter, an operation of deciding, by the decision unit 120, data from the memory page 111 immediately after data is programmed will be described. A first decision value of a multi-bit cell with a threshold voltage less than a voltage level 211 may be data "11". A first decision value of a multi-bit cell with a threshold voltage greater than a voltage level 212 and less than a voltage level 213 may be data "10". A first decision value of a multi-bit cell with a threshold voltage greater than the voltage level 213 and less than a voltage level 214 may be data "00". A first decision value of a multi-bit cell with a threshold voltage greater than the voltage level 214 and less than a voltage level 215 may be data "01".

The decision unit 120 may detect threshold voltages of multi-bit cells of the memory page 111 and perform hard-decision for the first data from the detected threshold voltages, using the first decision value.

When the number of error bits of the first data does not exceed the error correcting capability, the determination unit 140 may determine the data decision operation may not be performed anymore. The memory device 100 may output, as final data, the first data in which ECC decoding is performed and the error is corrected.

It is assumed that the threshold voltage of multi-bit cells may form the distributions 231, 232, 233, and 234 as a pre-determined period of time elapses after data is programmed. The decision unit 120 may detect the threshold voltages of the multi-bit cells of the memory page 111. The decision unit 120 may perform hard-decision for the first data from the detected threshold voltages, using the first decision value.

Data stored in the multi-bit cell with the threshold voltage less than the voltage level 211 may be decided as data "11". Referring to FIG. 2, a relatively fewer number of errors may be included in the multi-bit cell storing data "11".

Data stored in the multi-bit cell with the threshold voltage greater than the voltage level 212 and less than the voltage level 213 may be decided as data "10". The probability that data stored in the multi-bit cell storing data "00" may be erroneously decided as data "10" may be significantly large.

Similarly, data stored in the multi-bit cell with the threshold voltage greater than the voltage level 213 and less than the voltage level 214 may be decided as data "00". The probability that data stored in the multi-bit cell storing data "01" may be erroneously decided as data "00" may be significantly large.

When the number of error bits of the first data is greater than the error correcting capability, the determination unit 140 may determine that the decision unit 120 may decide second data from the detected threshold voltage. The determination unit 140 may determine a second decision value to be used while the decision unit 120 decides the second data.

The error detector 130 may estimate a corrected value of the detected error bit. When the number of error bits of the first data is greater than the error correcting capability, the error detector 130 may not correct all the error bits, but may estimate the corrected value of some error bits.

In FIG. 2, most of data that is erroneously decided as data "00" may be estimated as data "01". Also, most of data that is decided as data "10" may be estimated as data "00".

The determination unit 140 may analyze a tendency or a pattern of the detected error to thereby determine the second decision value. The determination unit 140 may determine, as data "11", the second decision value with respect to the threshold voltage less than the voltage level 211. The determination unit 140 may determine, as data "10", the second decision value with respect to the threshold voltage greater than the voltage level 211 and less than the voltage level 212. The determination unit 140 may determine, as data "00", the second decision value with respect to the threshold voltage greater than the voltage level 212 and less than the voltage level 213. The determination unit 140 may determine, as data "01", the second decision value with respect to the threshold voltage greater than the voltage level 213 and the voltage level 214.

The decision unit 120 may decide second data from the detected threshold voltages, using the determined second decision value. The error detector 130 may detect an error bit of the second data. When the number of error bits of the second data is less than the error correcting capability, the determination unit 140 may determine the data decision operation may not be performed anymore.

The decision unit 120 may apply a different second decision value with respect to each multi-bit cell. The decision unit 120 may apply the first decision value to multi-bit cells that are estimated to have a correct value. The decision unit 120 may apply the second decision unit, which may be different from the first decision value, to multi-bit cells that are estimated to store an error bit.

Figure 3:
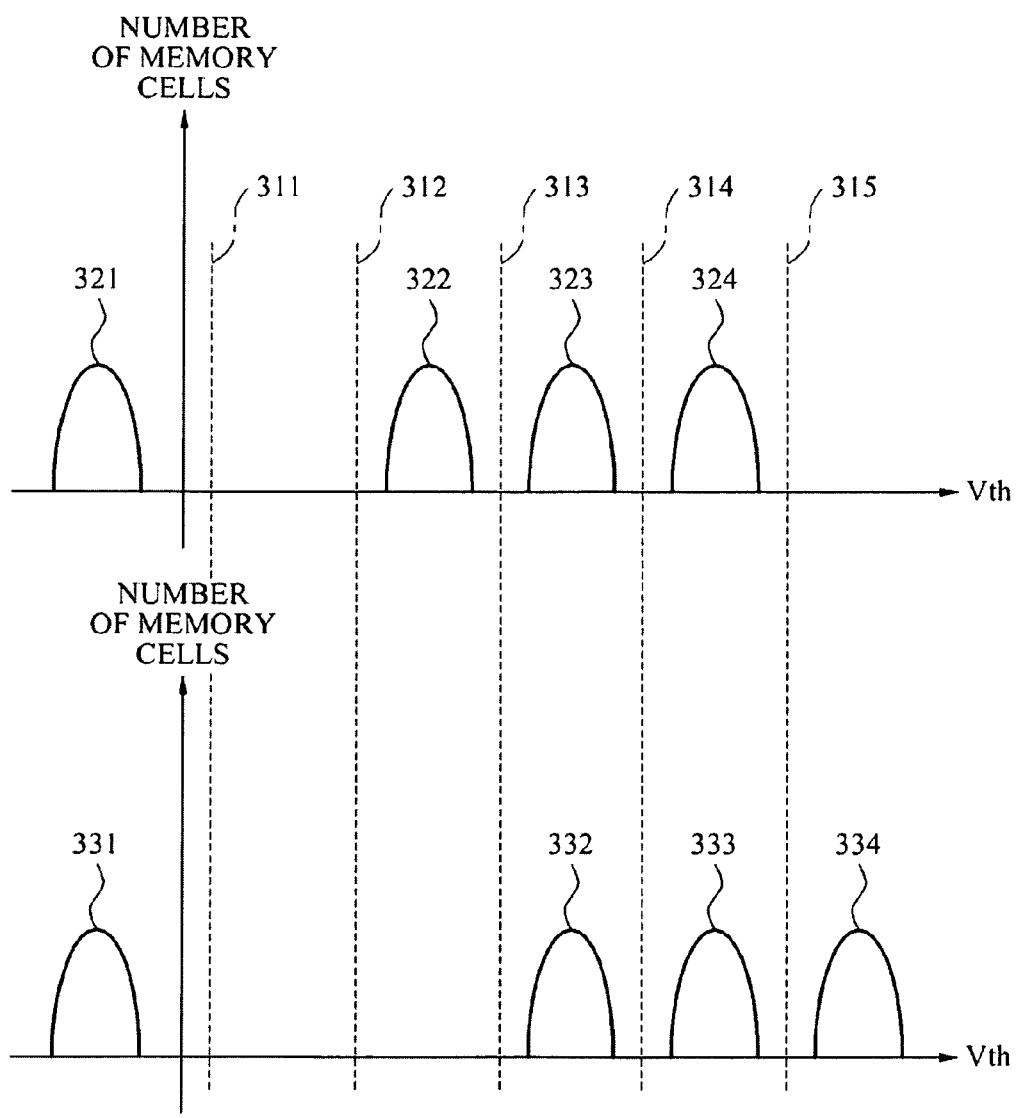
FIG. 3 illustrates an example of an operation of the memory device shown in FIG. 1.

FIG. 3 illustrates an example of an operation of the memory device 100 shown in FIG. 1.

In FIG. 3, the horizontal axis denotes the threshold voltage of multi-bit cells and the vertical axis denotes the number of multi-bit cells that have a corresponding threshold voltage. In FIG. 3, two-bit data is stored in each multi-bit cell. In FIG. 3, the decision unit 120 may perform hard-decision for first data.

The threshold voltage of multi-bit cells may change over time from a point immediately after programming. The threshold voltage of multi-bit cells may be affected by the change in the threshold voltage of adjacent different multi-bit cells and thereby change.

Immediately after data "11" is programmed, a threshold voltage of multi-bit cells storing data "11" may form a distribution 321. After a predetermined period of time is elapsed, the threshold voltage of multi-bit cells storing data "11" may form a distribution 331. It is assumed herein that the difference between the distributions 321 and 331 may be insignificant.

Immediately after data "10" is programmed, a threshold voltage of multi-bit cells storing data "10" may form a distribution 322. As the threshold voltage of surrounding multi-bit cells increases, the threshold voltage of multi-bit cells storing data "10" may increase. After a predetermined period of time is elapsed, the threshold voltage of multi-bit cells storing data "10" may form a distribution 332.

Immediately after data "00" is programmed, a threshold voltage of multi-bit cells storing data "00" may form a distribution 323. As the threshold voltage of surrounding multi-bit cells increases, the threshold voltage of multi-bit cells storing data "00" may increase. After a predetermined period of time is elapsed, the threshold voltage of multi-bit cells storing data "00" may form a distribution 333.

Immediately after data "01" is programmed, a threshold voltage of multi-bit cells storing data "01" may form a distribution 324. As the threshold voltage of surrounding multi-bit cell increases, the threshold voltage of multi-bit cells storing data "01" may increase. After a predetermined period of time is elapsed, the threshold voltage of multi-bit cells storing data "01" may form a distribution 334.

Hereinafter, an operation of deciding, by the decision unit 120, data from the memory page 111 immediately after data is programmed will be described. A first decision value of a multi-bit cell with a threshold voltage less than a voltage level 311 may be data "11". A first decision value of a multi-bit cell with a threshold voltage greater than a voltage level 312 and less than a voltage level 313 may be data "10". A first decision value of a multi-bit cell with a threshold voltage greater than the voltage level 313 and less than a voltage level 314 may be data "00". A first decision value of a multi-bit cell with a threshold voltage greater than the voltage level 314 and less than a voltage level 315 may be data "01".

The decision unit 120 may detect threshold voltages of multi-bit cells of the memory page 111 and perform hard-decision for the first data from the detected threshold voltages, using the first decision value.

When the number of error bits of the first data does not exceed the error correcting capability, the determination unit 140 may determine the data decision operation may not be performed anymore.

It is assumed that the threshold voltage of multi-bit cells may form the distributions 331, 332, 333, and 334 over time after data is programmed. The decision unit 120 may detect the threshold voltages of the multi-bit cells of the memory page 111. The decision unit 120 may perform hard-decision for the first data from the detected threshold voltages, using the first decision value.

Data stored in the multi-bit cell with the threshold voltage less than the voltage level 311 may be decided as data "11". Referring to FIG. 3, a relatively smaller number of errors may be included in the multi-bit cell storing data "11".

Data stored in the multi-bit cell with the threshold voltage greater than the voltage level 313 and less than the voltage level 314 may be decided as data "00". The probability that data stored in the multi-bit cell storing data "10" may be erroneously decided as data "00" may be significantly large.

Similarly, data stored in the multi-bit cell with the threshold voltage grater than the voltage level 314 and less than the voltage level 315 may be decided as data "01". The probability that data stored in the multi-bit cell storing data "00" may be erroneously decided as data "01" may be significantly large.

The error detector 130 may estimate a corrected value of the detected error bit. When the number of error bits of the first data is greater than the error correcting capability, the error detector 130 may not correct all the error bits, but may estimate the corrected value of some error bits.

In FIG. 3, most of data that is erroneously decided as data "01" may be estimated as data "00". Also, most of data that is decided as data "00" maybe estimated as data "10".

The determination unit 140 may analyze a tendency or a pattern of the detected error to thereby determine the second decision value. The determination unit 140 may determine, as data "11", the second decision value with respect to the threshold voltage less than the voltage level 311. The determination unit 140 may determine, as data "10", the second decision value with respect to the threshold voltage greater than the voltage level 313 and less than the voltage level 314. The determination unit 140 may determine, as data "00", the second decision value with respect to the threshold voltage greater than the voltage level 314 and less than 315. The determination unit 140 may determine, as data "01", the second decision value with respect to the threshold voltage greater than 315.

The decision unit 120 may decide second data from the detected threshold voltages, using the determined second decision value. The error detector 130 may detect an error bit of the second data. When the number of error bits of the second data is less than the error correcting capability, the determination unit 140 may determine that the data decision operation may not be performed anymore.

Figure 4:
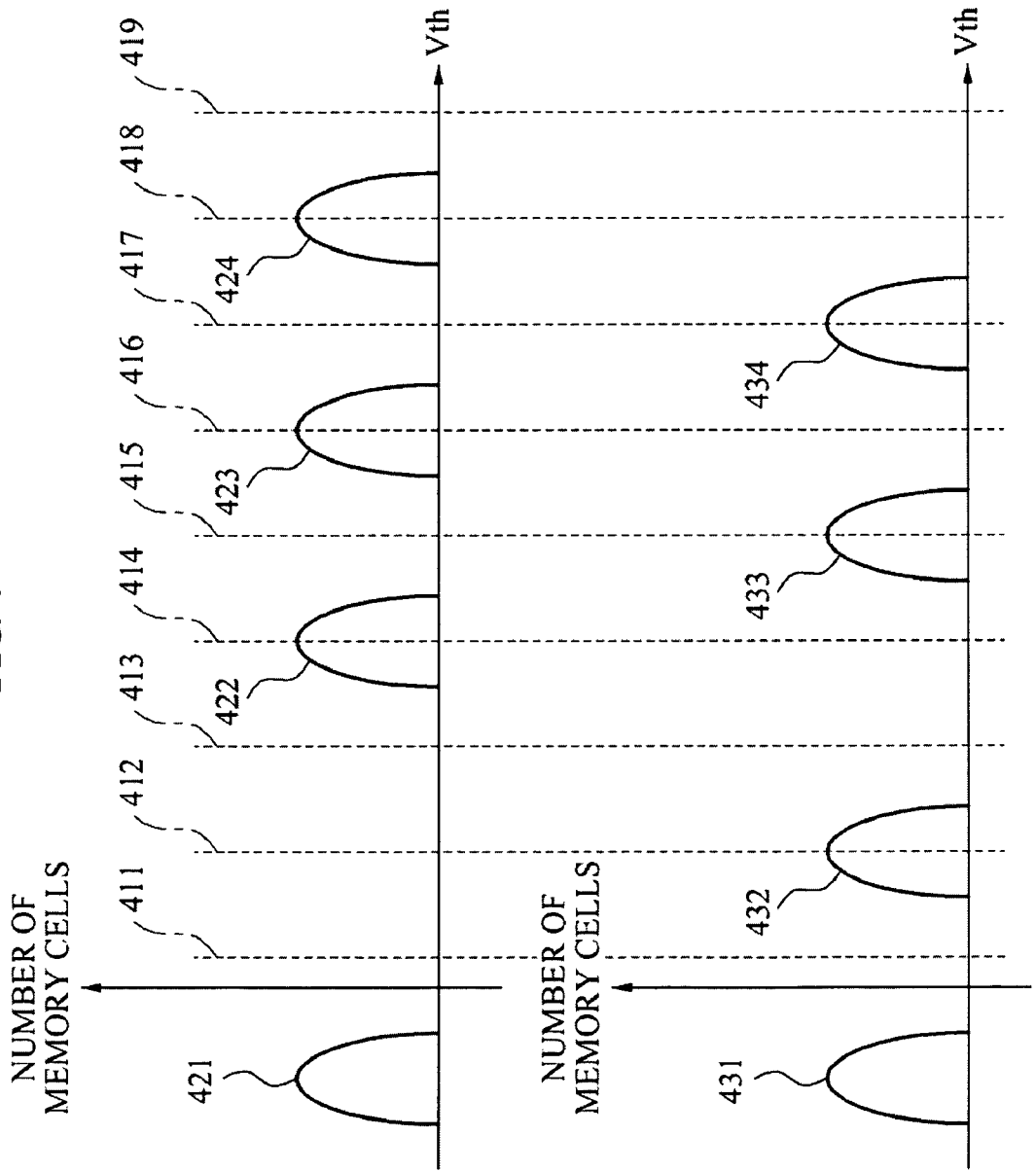
FIG. 4 illustrates an example of an operation of the memory device shown in FIG. 1.

FIG. 4 illustrates an example of an operation of the memory device shown in FIG. 1.

In FIG. 4, the horizontal axis denotes the threshold voltage of multi-bit cells and the vertical axis denotes the number of multi-bit cells that have a corresponding threshold voltage. In FIG. 4, two-bit data is stored in each multi-bit cell. In FIG. 3, the decision unit 120 may perform soft-decision for first data.

The threshold voltage of multi-bit cells may change over time from a point immediately after programming. The threshold voltage of multi-bit cells may be affected by the change in the threshold voltage of adjacent different multi-bit cells and thereby change.

Immediately after data "11" is programmed, a threshold voltage of multi-bit cells storing data "11" may form a distribution 421. After a predetermined period of time is elapsed, the threshold voltage of multi-bit cells storing the data "11" may form a distribution 431. It is assumed herein that the difference between the distributions 421 and 431 may be insignificant.

Immediately after data "10" is programmed, a threshold voltage of multi-bit cells storing data "10" may form a distribution 422. The threshold voltage of multi-bit cells storing data "10" may be decreased over time. After a predetermined period of time is elapsed, the threshold voltage of multi-bit cells storing data "10" may form a distribution 432.

Immediately after data "00" is programmed, a threshold voltage of multi-bit cells storing data "00" may form a distribution 423. The threshold voltage of multi-bit cells storing data "00" may be decreased over time. After a predetermined period of time is elapsed, the threshold voltage of multi-bit cells storing data "00" may form a distribution 433.

Immediately after data "01" is programmed, a threshold voltage of multi-bit cells storing data "01" may form a distribution 424. The threshold voltage of multi-bit cells storing data "01" may be decreased over time. After a predetermined period of time is elapsed, the threshold voltage of multi-bit cells storing the data "01" may form a distribution 434.

Hereinafter, an operation of deciding, by the decision unit 120, data from the memory page 111 after data is programmed will be described. A first decision value may be a set of LLRs with respect to four data values that can be stored in multi-bit cells respectively.

A first decision value of a multi-bit cell with a threshold voltage less than a voltage level 411 may be, for example, a set of 0.95 with respect to data "11", 0.03 with respect to data "10", 0.01 with respect to data "00", and 0.01 with respect to data "01". In this instance, the first decision value may be expressed as (0.95, 0.03, 0.01, 0.01).

A first decision value of a multi-bit cell with a threshold voltage greater than the voltage level 411 and less than a voltage level 413 may be, for example, a set of 0.5 with respect to data "11", 0.4 with respect to data "10", 0.03 with respect to data "00", and 0.02 with respect to data "01". In this instance, the first decision value may be expressed as (0.5, 0.4, 0.03, 0.02).

A first decision value of a multi-bit cell with a threshold voltage greater than the voltage level 413 and less than a voltage level 415 may be, for example, a set of 0.02 with respect to data "11", 0.95 with respect to data "10", 0.02 with respect to data "00", and 0.01 with respect to data "01". In this instance, the first decision value may be expressed as (0.02, 0.95, 0.02, 0.01).

A first decision value of a multi-bit cell with a threshold voltage greater than the voltage level 415 and less than a voltage level 417 may be, for example, a set of 0.01 with respect to data "11", 0.02 with respect to data "10", 0.95 with respect to data "00", and 0.02 with respect to data "01". In this instance, the first decision value may be expressed as (0.01, 0.02, 0.95, 0.02).

A first decision value of a multi-bit cell with a threshold voltage greater than a voltage level 417 may be, for example, a set of 0.01 with respect to data "11", 0.02 with respect to data "10", 0.02 with respect to data "00", and 0.95 with respect to data "01". In this instance, the first decision value may be expressed as (0.01, 0.02, 0.02, 0.95).

The decision unit 120 may detect threshold voltages of multi-bit cells of the memory page 111 and perform soft-decision for the first data from the detected threshold voltages, using the first decision value.

When the number of error bits of the first data does not exceed the error correcting capability, the determination unit 140 may determine the data decision operation may not be performed anymore. The memory device 100 may output, as final data, the first data in which ECC decoding is performed and the error is corrected.

It is assumed that the threshold voltage of multi-bit cells may form the distributions 431, 432, 433, and 434 over a period of time after data is programmed. The decision unit 120 may detect the threshold voltages of the multi-bit cells of the memory page 111. The decision unit 120 may perform soft-decision for the first data from the detected threshold voltages, using the first decision value.

Data stored in the multi-bit cell with the threshold voltage less than the voltage level 411 may be decided as data "11". Referring to FIG. 4, a relatively smaller number of errors may be included in the multi-bit cell storing data "11".

Since the first decision value of the multi-bit cell with the threshold voltage greater than the voltage level 411 and less than the voltage level 413 is (0.5, 0.4, 0.03, 0.02), the data stored in the multi-bit cell may be soft-decided as data "11". The probability that data stored in the multi-bit cell storing data "10" may be erroneously decided as data "11" may be significantly large.

The determination unit 140 may adjust a second decision value so that the data stored in the multi-bit cell with the threshold voltage greater than the voltage level 411 and less than the voltage level 413 may be decided as data "10".

Since the first decision value of the multi-bit cell with the threshold voltage greater than the voltage level 414 and less than the voltage level 415 is (0.02, 0.95, 0.02, 0.01), the data stored in the multi-bit cell may be soft-decided as data "10". The probability that data stored in the multi-bit cell storing data "00" may be erroneously decided as data "10" may be significantly large.

The determination unit 140 may adjust a second decision value so that the data stored in the multi-bit cell with the threshold voltage greater than the voltage level 414 and less than the voltage level 415 may be decided as data "00".

Since the first decision value of the multi-bit cell with the threshold voltage greater than the voltage level 415 and less than the voltage level 416 is (0.01, 0.02, 0.95, 0.02), the data stored in the multi-bit cell may be soft-decided as data "00". A decision error with respect to a section of the threshold voltage greater than the voltage level 415 and less than the voltage level 416 may be insignificant. The determination unit 140 may determine the second decision value to be the same as the first decision value for the threshold voltage section greater than the voltage level 415 and less than the voltage level 416.

The determination unit 140 may adjust a second decision value of a threshold voltage section greater than the voltage level 416 and less than the voltage level 417 so that data stored in the multi-bit cell with the threshold voltage greater than the voltage level 416 and less than the voltage level 417 may be decided as data "01".

The decision unit 120 may decide second data from the detected threshold voltages, using the determined second decision value. The error detector 130 may detect an error bit of the second data. When the number of error bits of the second data is less than the error correcting capability, the determination unit 140 may determine the data decision operation may not be performed anymore.

The decision unit 120 may set the voltage levels 411, 412, 413, 414, 415, 416, 417, 418, and 419 as necessary and detect the threshold voltage of multi-bit cells of the memory page 111.

Generally, a threshold voltage of multi-bit cells storing of m bits of data may form $2^m$ distributions. According to example embodiments, the decision unit 120 may set $2^m$ or more voltage levels. The decision unit 120 may set $2^m$ or more voltage levels and detect threshold voltages of multi-bit cells using the set voltage levels. Through this, the decision unit 120 may determine an improved or optimal decision value even with respect to an unexpected change in the threshold voltages of multi-bit cells.

Figure 5:
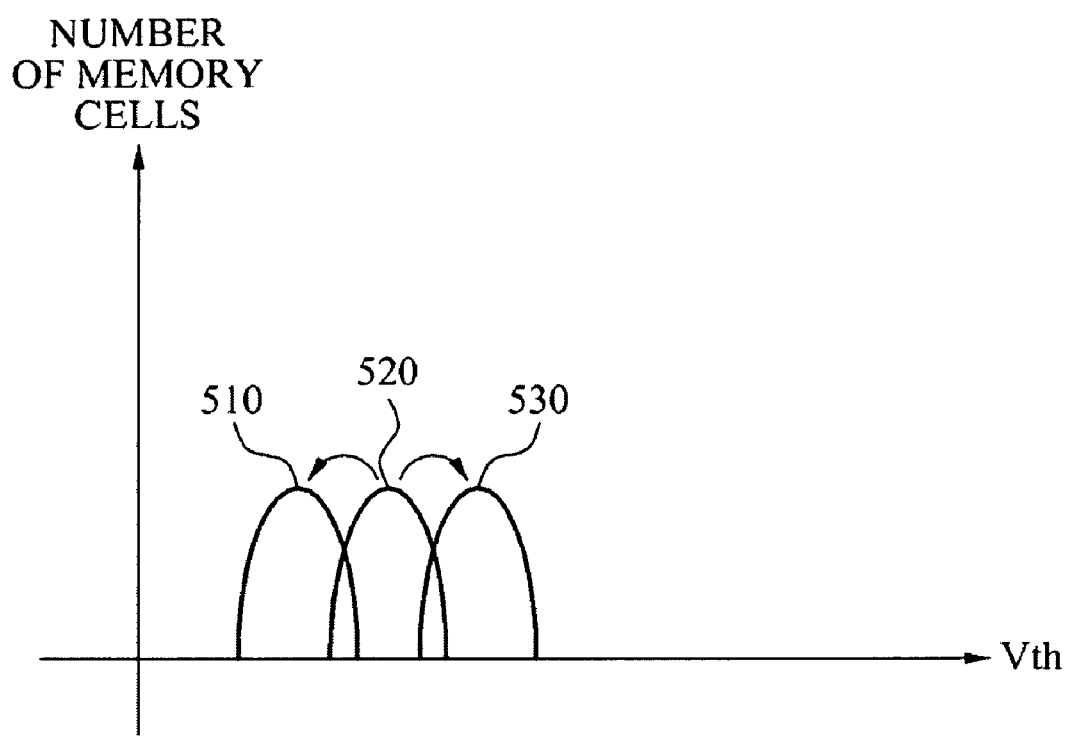
FIG. 5 illustrates an example of a change in a threshold voltage of multi-bit cells according to example embodiments.

FIG. 5 illustrates an example of a change in threshold voltages of multi-bit cells according to example embodiments.

In FIG. 5, the horizontal axis denotes the threshold voltage of multi-bit cells and the vertical axis denotes the number of multi-bit cells that have a corresponding threshold voltage.

Multi-bit cells storing particular data may correspond to a distribution 520. A voltage level of the multi-bit cells corresponding to the distribution 520 may change over time or may change according to change in a threshold voltage of surrounding multi-bit cells. When the threshold voltage of multi-bit cells decreases over time, the threshold voltage of multi-bit cells may form a distribution 510 after a predetermined period of time is elapsed.

When the threshold voltage of multi-bit cells increases (due to a programming process of surrounding multi-bit cells) as the threshold voltage of surrounding multi-bit cells increases, the threshold voltage of multi-bit cells may form a distribution 530 after a predetermined period of time is elapsed.

The charge loss may cause the threshold voltages of the multi-bit cells to decrease over time.

In the multi-bit cell, an insulating layer may be disposed between a control gate and a floating gate and another insulating layer may be disposed between the floating gate and a substrate. A memory device may charge charges to the floating gate or discharge the charges from the floating gate by applying a particular voltage to the control gate and the substrate of the multi-bit cell. A process of charging charges to the floating gate or discharging the charges from the floating gate may be performed according to mechanism such as F-N tunneling, hot carrier effect, and the like. The charges charged to the floating gate should be maintained in the floating gate until a discharging condition is prepared. However, if the charges charged in the floating gate spread due to a natural spreading phenomenon and thereby the charges reduce, or if the insulating layer surrounding the floating gate is damaged and thereby a charge leaking path is formed, the charges charged in the floating gate may be lost.

Generally, the charge loss mechanism that the charges charged to the floating gate are lost may decrease the threshold voltage of the multi-bit cell.

The phenomenon that a threshold voltage of a central multi-bit cell is affected by a change amount of threshold voltage of surrounding multi-bit cells may be referred to as "floating gate (FG) coupling". Specifically, the threshold voltage of the central multi-bit cell may be affected by coupling of parasitic capacitance between floating gates of multi-bit cells.

When the programming process increases the threshold voltage of the multi-bit cell, the threshold voltage of the central multi-bit cell may be increased to greater than a desired value due to FG coupling.

Due to the mechanism such as FG coupling, a distribution of threshold voltage of multi-bit cells may be spread. Generally, when the threshold voltage is low, a greater change may incur in the threshold voltage due to FG coupling.

Since a voltage window where the multi-bit cell operates is limited, a distribution of the threshold voltage may overlap another distribution of an adjacent threshold voltage as the distribution of the threshold voltage spreads. As an overlapping level increases, an error rate of inaccurately reading data stored in the multi-bit cell may increase.

Figure 6:
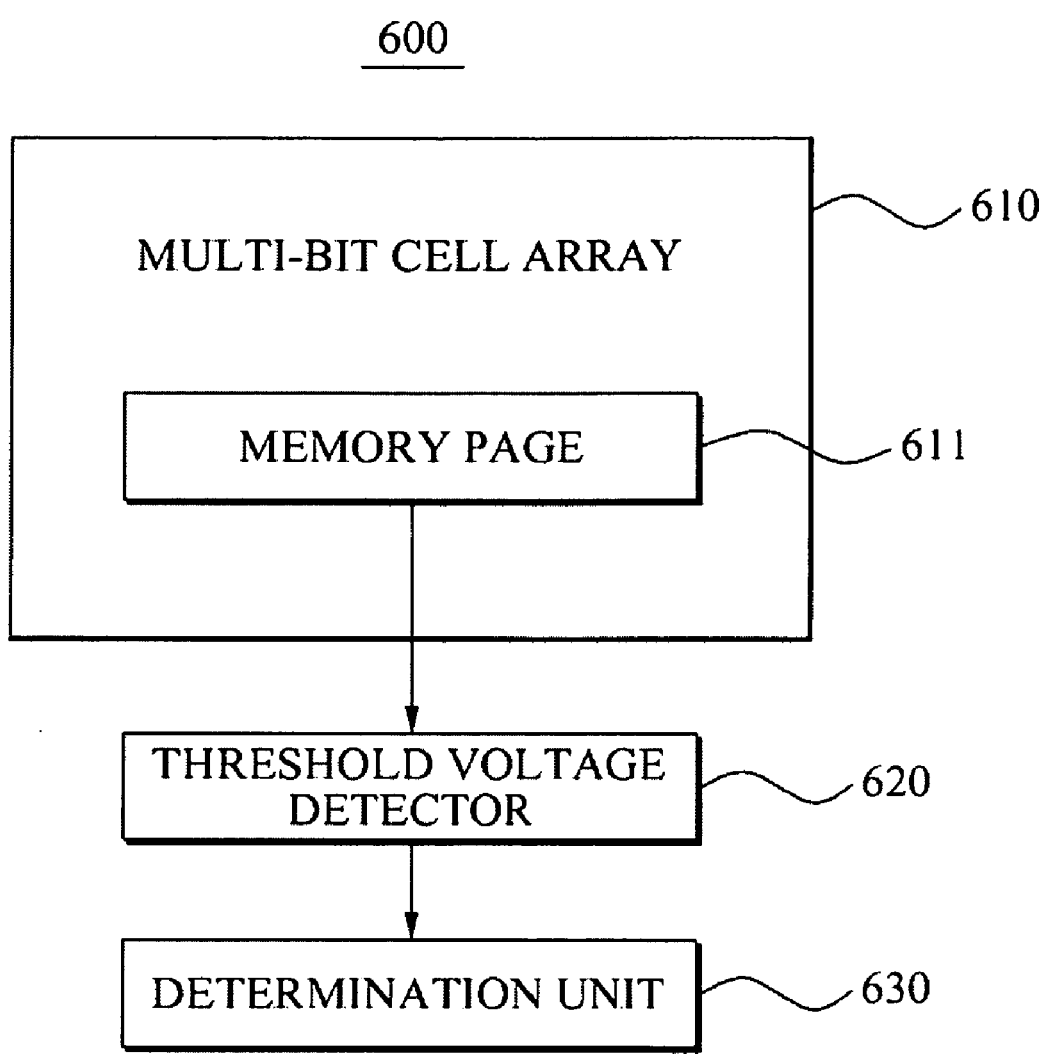
FIG. 6 is a block diagram illustrating a memory device according to example embodiments.

FIG. 6 is a block diagram illustrating a memory device 600 according to example embodiments.

The memory device 600 may include a multi-bit cell array 610, a threshold voltage detector 620, and a determination unit 630.

The multi-bit cell array 610 may further include a plurality of memory pages (not shown) in addition to a memory page 611. The memory page 611 may include a plurality of multi-bit cells. The memory device 600 may simultaneously read data stored in the plurality of multi-bit cells of the memory page 611.

The threshold voltage detector 620 may detect threshold voltages of the multi-bit cells of the memory page 611.

The determination unit 630 may select an improved or optimal decision value from candidate decision values. The improved or optimal decision value may reduce or minimize a number of error bits. The candidate decision values may decide data from the detected threshold voltages.

The determination unit 630 may apply a different decision value to each of the multi-bit cells of the memory page 630. The determination unit 630 may select the improved or optimal decision value based on a number of times that the multi-bit cells are erased, an elapsed time after data is programmed, and the like. The determination unit 630 may select the improved or optimal decision value based on charge loss characteristic information or coupling characteristic information of the multi-bit cell. The memory device 600 may obtain the coupling characteristic or the charge loss characteristic depending on a physical location of a particular multi-bit cell in the multi-bit cell array 610. The memory device 600 may monitor a change in the threshold voltage of the particular multi-bit cell to thereby obtain the coupling or the charge loss characteristic. The memory device 600 may set a particular block of the multi-bit cell array 610 as a monitoring block to thereby monitor the change in the threshold voltage of the multi-bit cell of the monitoring block.

According to example embodiments, the determination unit 630 may generate a decision result by applying a plurality of candidate decision values, perform ECC decoding for the generated decision result with respect to each candidate decision value, and compare a number of errors bits. The determination unit 630 may select, as an improved or optimal decision value, a combination of decision values that can reduce or minimize the number of error bits.

The memory device 600 may reduce or minimize a number of detections for the threshold voltage of multi-bit cells. The memory device 600 may reduce or minimize the number of detections for the threshold voltage of multi-bit cells to thereby reduce a data read time.

The memory device 600 may select an improved or optimal decision value reducing or minimizing the number of error bits to thereby reduce an error in reading memory data. When the memory device 600 uses an ECC decoder, it is possible to reduce the error in reading the memory data to thereby reduce hardware complexity for embodying the ECC decoder.

Figure 7:
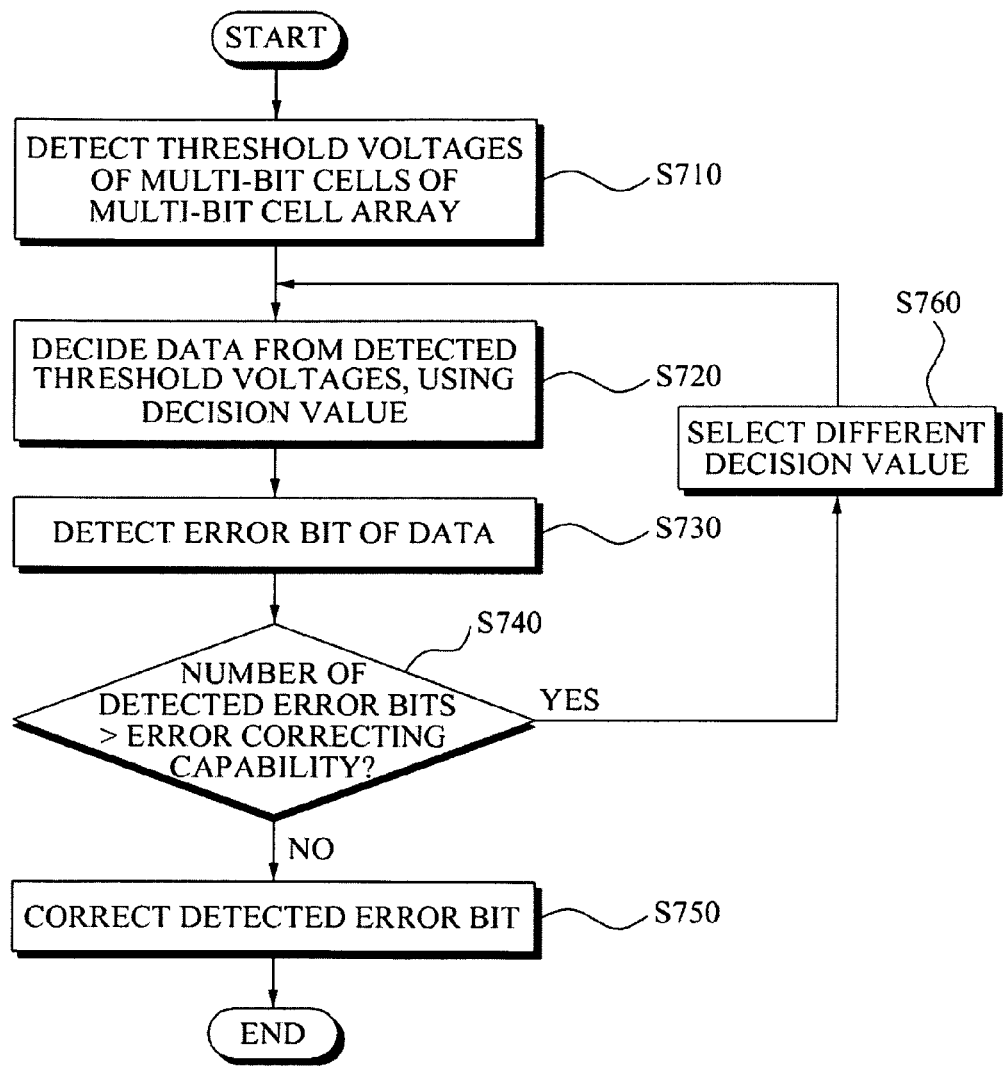
FIG. 7 is a flowchart illustrating a method of reading memory data according to example embodiments.

FIG. 7 is a flowchart illustrating a method of reading memory data according to example embodiments.

In operation S710, threshold voltages of memory cells of a multi-bit cell array may be detected.

In operation S720, data may be decided from the detected threshold voltages, using a decision value.

In operation S730, one or more error bits of the decided data may be detected.

In operation S740, it may be determined whether the number of detected error bits is greater than an error correction range or an error correcting capability.

In operation S750, when the number of detected error bits is less than or equal to the error correcting capability, detected error bits may be corrected.

Conversely, when the number of detected error bits is greater than the error correcting capability, a different decision value may be selected in operation S760.

In operation S720, data may be decided from the threshold voltages detected in operation S710, using the decision value selected in operation S760.

In operation S760, a different decision value may be selected based on a pattern of the error bit detected in operation S730.

When the number of detected error bits is greater than a reference value, it is possible to adjust an initially used decision value. The adjusted decision value may be initially applied to operation S720 of a subsequent data reading operation.

When a relatively large number of error bits are detected based on the initially applied decision value, it may take long time to read data. Therefore, the memory data read method may adjust the decision value to be initially adjusted based on an error bit detection result. The reference value may be greater than the error correcting capability and may also be less than the error correcting capability.

According to example embodiments, the memory data read method may apply a different decision value to each multi-bit cell. For example, the memory data read method may identify a multi-bit cell storing an error bit detected in operation S730. Also, the memory data read method may apply a second decision value to the identified multi-bit cell. The second decision value may be different from a first decision value to be applied to remaining multi-bit cells.

The memory data read method according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media may include magnetic media such as hard disks, floppy disks, and magnetic tape; optical media, for example CD ROM disks and DVD; magneto-optical media, for example optical disks; and hardware devices that are specially configured to store and perform program instructions, for example read-only memory (ROM), random access memory (RAM), flash memory, and the like. Examples of program instructions may include both machine code, for example produced by a compiler, and files containing higher level code that may be executed by the computer using an interpreter. The described hardware devices may be configured to act as one or more software modules in order to perform the operations of example embodiments or vice versa.

Flash memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device for example, a host using any one of various types of protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system according to example embodiments may include a microprocessor that is electrically connected with a bus, a user interface, a modem, for example a baseband chipset, a main controller, and a flash memory device. The flash memory device may store N-bit data via the main controller. The N-bit data may be processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The main controller and the flash memory device may constitute a solid state drive/disk (SSD) that uses a non-volatile memory to store data.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory device comprising:
a multi-bit cell array;
a decision unit configured to detects threshold voltages of multi-bit cells of the multi-bit cell array to decide first data from the detected threshold voltages using a first decision value;
an error detector configured to detects one or more error bits of the first data; and
a determination unit configured to determines whether the decision unit decides second data from the detected threshold voltages using a second decision value, based on a number of detected error bits, the second decision value being different from the first decision value,
wherein the first and second decision values are first and second sets of log likelihood ratios (LLR), respectively.

2. The memory device of claim 1, wherein the determination unit is configured to selects the second decision value based on a pattern of the one or more detected error bits.

3. The memory device of claim 1, wherein the determination unit is configured to adjust the first decision value based on at least one of floating gate coupling and a charge loss mechanism to form the second decision value.

4. The memory device of claim 1, wherein the decision unit is configured to performs hard-decision for the first data from the detected threshold voltages, using the first decision value.

5. The memory device of claim 1, wherein
the decision unit is configured to performs soft-decision for the first data from the detected threshold voltages, using the first decision value.

6. The memory device of claim 1, wherein the determination unit is configured to determines that the decision unit decides the second data from the detected threshold voltages using the second decision value if the number of detected error bits is greater than an error correction range.

7. The memory device of claim 1, wherein:
if the determination unit identifies a multi-bit cell storing a detected error bit from among the one or more detected error bits,
the decision unit is configured to decides the second data from a detected threshold voltage of the identified multi-bit cell, using the second decision value.

8. A method of reading data from a memory, comprising:
detecting threshold voltages of multi-bit cells of a multi-bit cell array;
deciding first data from the detected threshold voltages using a first decision value;
detecting one or more error bits of the first data; and
determining whether to decide second data from the detected threshold voltages using a second decision value based on a number of detected error bits, the second decision value being different from the first decision value,
wherein the first and second decision values are first and second sets of log likelihood ratios (LLR), respectively.

9. The method of claim 8, further comprising:
selecting the second decision value based on a pattern of the one or more detected error bits.

10. The method of claim 8, wherein when the number of detected error bits is greater than an error correction range, the determining determines the second data is decided from the detected threshold voltages using the second decision value.

11. The method of claim 8, further comprising:
identifying a multi-bit cell storing a detected error bit from among the one or more detected error bits; and
deciding the second data from a detected threshold voltage of the identified multi-bit cell, using the second decision value.

12. The method of claim 8, further comprising:
adjusting the first decision value when the number of detected error bits is greater than a reference value.

13. A computer-readable recording medium storing a program for implementing the method of claim 8.

14. The memory device of claim 1, wherein the first and second sets of LLRs each include a log likelihood ratio corresponding to each possible data value for data that can be stored in a cell from among the multi-bit cell array.

15. The method of claim 8, wherein the first and second sets of LLRs each include a log likelihood ratio corresponding to each possible data value for data that can be stored in a cell from among the multi-bit cell array.

* * * * *